(12) United States Patent
Turner et al.

(10) Patent No.: US 8,664,990 B2
(45) Date of Patent: Mar. 4, 2014

(54) COHERENT PHASE LOCKED LOOP

(71) Applicants: Steven E. Turner, Nashua, NH (US); Lawrence J. Kushner, Andover, MA (US)

(72) Inventors: Steven E. Turner, Nashua, NH (US); Lawrence J. Kushner, Andover, MA (US)

(73) Assignee: BAE Systems Information and Electronics Systems Integration Inc., Nashau, NH (US)

( * ) Notice: Subject to any disclaimer, the term of this patent is extended or adjusted under 35 U.S.C. 154(b) by 0 days.

(21) Appl. No.: 13/761,300

(22) Filed: Feb. 7, 2013

(65) Prior Publication Data
US 2013/0214837 A1    Aug. 22, 2013

Related U.S. Application Data

(60) Provisional application No. 61/633,809, filed on Feb. 16, 2012.

(51) Int. Cl.
*H03L 7/06* (2006.01)

(52) U.S. Cl.
USPC .......................................... 327/156; 327/147

(58) Field of Classification Search
USPC .................................................. 327/147, 156
See application file for complete search history.

(56) References Cited

U.S. PATENT DOCUMENTS

| | | | |
|---|---|---|---|
| 6,553,089 B2 * | 4/2003 | Huh et al. | 375/376 |
| 6,704,383 B2 * | 3/2004 | Lee et al. | 375/376 |
| 7,496,168 B2 * | 2/2009 | Leonowich et al. | 375/376 |
| 7,801,261 B2 * | 9/2010 | Chakravarthy | 375/376 |
| 8,391,419 B2 * | 3/2013 | Ku et al. | 375/326 |
| 2002/0136341 A1 * | 9/2002 | Huh et al. | 375/376 |
| 2002/0136342 A1 * | 9/2002 | Lee et al. | 375/376 |
| 2006/0245531 A1 * | 11/2006 | Leonowich et al. | 375/376 |
| 2009/0251225 A1 * | 10/2009 | Chen et al. | 331/1 A |
| 2013/0099839 A1 * | 4/2013 | Kao et al. | 327/158 |
| 2013/0214837 A1 * | 8/2013 | Turner et al. | 327/158 |

* cited by examiner

*Primary Examiner* — Adam Houston
(74) *Attorney, Agent, or Firm* — Daniel J. Long

(57) ABSTRACT

In a fractional-n Phase Locked Loop the frequency control word multiplies by the output of a reference counter to provide the carry bit utilized in n/n+1 switching.

20 Claims, 10 Drawing Sheets

Phase Coherent Approach

Traditional Approach

**Traditional Approach
(Alternative Embodiment
with Phase Offset Control)**

Phase Coherent Approach

Phase Coherent Approach
(Alternative embodiment with phase offset control)

COHERENT PHASE LOCKED LOOP

RELATED APPLICATIONS

This Application claims rights under 35 USC §119 (e) from U.S. Provisional Application Ser. No. 61/633,809 filed Feb. 16, 2012, the contents of which are incorporate herein by reference.

FIELD OF THE INVENTION

This invention relates to phase locked loops and more particularly to a system for maintaining phase coherency in fractional-n phase locked loops when switching from one frequency to another and back again.

BACKGROUND OF THE INVENTION

It has been found in fractional-n phase locked loops (PLLs) when switching from one frequency represented by n to a second frequency represented by n+1, that the phase of the output signal generated at one frequency is not always phase coherent with the same frequency signal generated at a previous time when the PLL switches back to it. What this means is that when changing from a frequency A to a frequency B and then back to a frequency A signal, the phase of the frequency A signal is not necessarily matched to that of the previously generated frequency A signal. Further, with traditional fractional-n phase locked loops the phase difference between an originally-generated frequency A signal and a subsequently-generated frequency A signal is not just a matter of a rounding error of a few degrees but may exist anywhere.

In order to preserve coherency in the fractional-n phase locked loops in the past a so-called phase resync system has been employed to preserve coherency. This phase resync system employs a periodic pulse to which the generated signals are slaved. However, these periodic pulses may introduce spurs. Moreover the pulse timing required must be precisely regulated. Otherwise the pulse timing may cause the phase locked loop to unlock if the loop bandwidth is too wide.

In fractional-n phase locked loops the switching between the n and n+1 frequencies is governed by the overflow carry bit in a traditional accumulator. This accumulator has memory in the sense that when a carry bit is generated, it is generated based on overflow from the accumulated count. Its generation is thus based on a number in the accumulator that has no necessary relationship to the timing of the carry bit used to generate an original signal. If the PLL tries to again generate a signal at this original frequency after switching to a second frequency, the carry bit used in switching back to the original frequency will not be generated at a time corresponding to the time that the carry bit for the original frequency was generated. The problem is that the phase locked loop does not start up in the same state as that of the originally-generated signal. The differing states result in different output phases and thus there is no phase coherency between the originally-generated and subsequently-generated signals of the same frequency.

It has been found that the reason lies in the way the duty cycle for n/n+1 is controlled. In the prior art duty cycle control is provided by adding a number to the accumulator used.

It is noted that the fractional-n phase locked loop is used for increased frequency resolution or fine frequency adjustment, especially in electronic warfare applications. In order to achieve fine frequency control in the fractional-n PLL, a reference frequency is first multiplied by one fractional number, n, and then by another fractional number n+1, with the fine frequency control being dependent on the duty cycle between n and n+1.

Not only is phase coherency important when utilizing a single phase locked loop, when multiple phase locked loops are utilized in a communication system it is important that all of the signals be in phase or have a predefined phase relationship between them. Because traditional fractional-n phase locked loops do not result in phase coherency, it is only with difficulty that multiple phase locked loops can be coherently phase aligned.

By way of further background, another way of preserving phase coherency in frequency generation relates to direct digital synthesis. In this regard a method is described in U.S. Pat. No. 8,115,519 to Steven E. Turner assigned to the assignee hereof and incorporated herein by reference in which phase coherency is provided by multiplying the output of a master accumulator with a frequency control word.

The result is that the sinusoidal DDS output is based on a multiple of the frequency control word and the incrementing reference phase and thus remains locked to the incrementing reference phase. This provides phase coherency even when the frequency control word changes to change the frequency.

It will be appreciated that direct digital synthesis is not generally used in battery powered radios due to its computational complexity and the resulting high power consumption. When direct digital synthesis is used in for instance battery powered units such as a handheld radio or in unmanned aerial vehicles, the power consumption of these direct digital synthesis devices can be as much as 10 times that associated with phase locked loops. The result is that direct digital synthesis is not applicable to electronic warfare systems in which power consumption and heat dissipation is a problem.

In summary, it will be appreciated that in prior fractional-n phase locked loops, the control of the switching between n/n+1 so as to adjust the duty cycle and thus the average of the two frequencies was accomplished by adding a fractional divide control number to the number in an accumulator. Since the overflow bit from the accumulator, called the carry bit, is used to control the n/n+1 switching the timing of the carry bit may be adjusted based on the fractional divide number added to the accumulator that controls when the n/n+1 switching occurs.

Since when going from frequency A to frequency B the accumulator continues to accumulate, when going back to frequency A, frequency A will start up at some undefined time depending on the accumulated count.

Note, the timing of the overflow carry bit is dependent upon the length of time that it takes to clock the accumulator from a reset point or a count of "0" to its overflow. If one wants to shorten the time period from a reset to the generation of an overflow bit one can add a fractional divide control number to the accumulator. This added number is between 1 and the number reflecting the maximum size of the accumulator, such that in the clocking of the accumulator the overflow carry bit is generated sooner than would be the case as if no number were added.

The lack of phase coherency of a frequency A signal with respect to an originally generated frequency A signal is the result of adding a number to the count in an accumulator that continues to accumulate. If this added number causes a roll over the carry bit no longer starts in phase with the carry bit used to generate the original frequency. The result is that the signal generated by the n/n+1 switching does not start in phase with the originally generated signal.

The method of adding numbers to an accumulator to control the duty cycle of the fractional-n PLL thus results in a lack of coherency between an originally generated signal and a subsequently generated signal after having switched from the original frequency to another frequency and then back again.

SUMMARY OF THE INVENTION

It has been found that rather than adding numbers to an accumulator to control the duty cycle, multiplying the number from a reference counter by a fractional divide control number always results in n/n+1 switching such that a subsequently generated signal is in-phase with an originally generated signal. Note that this reference counter is clocked to increase its count by 1 with each clock pulse.

With this type of reference counter, the number originally utilized to generate a carry bit is multiplied by a number, to change the n/n+1 duty cycle. When multiplying the reference counter output with a duty cycle control number, the resulting carry bit occurs at a time that is an exact multiple in this of the time that the carry bit responsible for the original signal was generated. Since the start times of the carry bits are in phase, this establishes phase coherence between the originally generated and the subsequently generated signals.

Note that this multiplier method to control duty cycle operates to control duty cycle in the same way as the prior art added fractional divide control number does.

The reason for the coherence in the subject method is the use of a reference counter that is continuously increased by 1 with each clock pulse. Thus, the reference counter is continuously clocked and is rolling over all the time. The result is that no matter what one multiplies the reference counter contents by, the carry pulse created will always be in phase the carry pulse one that started frequency A. This is because one never changes the increment of the reference counter. The multiplied result thus has a fixed phase relative to the reference counter. This being the case, the fractional-n PLL-generated signals for a given frequency, when switched away from and then revisited in the n/n+1 switch sequence, are phase coherent.

Because of the precise phasing associated with the above technique, when multiple phase locked loops are used one can easily adjust signals from all of the phase locked loops to be phase coherent or have a predetermined phase relationship. Precise phase adjustment between the multiple phase locked loops is accomplished in one embodiment by employing a phase offset that is added to the output of the reference counter prior to multiplying with a fractional divide control number. Alternatively, one can utilize the phase offset after the multiplying step. In either case the phase offset provides for accurate control of the phase between the signals generated by the fractional-n phase locked loops.

In summary, phase coherency in a fractional-n phase locked loop is established by utilizing a reference counter clocked to increment its count by one with each clock pulse and by multiplying the number in the reference counter by a frequency control word to control the n/n+1 duty cycle.

BRIEF DESCRIPTION OF THE DRAWINGS

These and other features of the subject invention will be better understood in connection with the detailed description of which.

DETAILED DESCRIPTION

Figure 1:
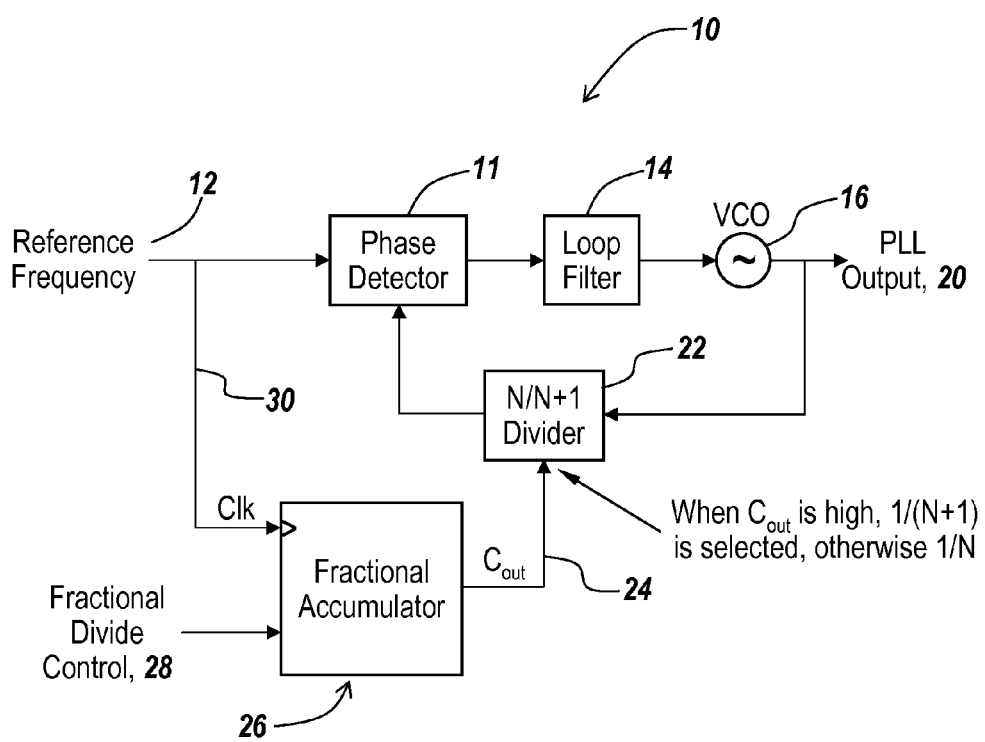
FIG. 1 is a block diagram of a prior art fractional-n phase locked loop, indicating the utilization of a carry bit to switch between n/n+1 frequency divide for the phase locked loop.

Referring now to FIG. 1 in the prior art a fractional-n phase locked loop 10 includes a phase detector 11 provided with a reference frequency 12, with the output of the phase detector coupled to a loop filter 14 and then to a voltage-controlled oscillator 16, the output of which forms the phase locked loop output 20. The phase locked loop output is fed back to phase detector 11 through an n/n+1 divider 22, with the switching of divider 22 being controlled by a carry bit on line 24 which is generated by a fractional accumulator 26 that is provided with a fractional divide control number 28 and is clocked on line 30 by reference frequency 12.

It is the purpose of the fractional divide control number to control the switching of the n/n+1 divider between a first frequency and a second frequency so as to be able to control the average of the two frequencies in terms of a controllable duty cycle. The result of controlling the duty cycle is to be able to finely control the frequency of the signal outputted by the phase locked loop. Here the fractional divide control number is added to the count in the functional accumulator for duty cycle and thus fine frequency control.

In operation, phase locked loop (PLL) 10 uses reference frequency 12 that is the desired PLL output frequency divided by N. Voltage controlled oscillator (VCO) 16 generates the PLL output frequency. If the reference frequency and the PLL output/N are the same frequency and at the same phase, phase detector 11 has zero output and the VCO-controlled frequency is not changed and the PLL phase is locked. When the phase of the reference frequency and the PLL output/N are different, either having the same frequency but a different phase, or are at different frequencies, the phase detector output controls VCO 16 to either speed up and increase the PLL output frequency or slow down to decrease the PLL output frequency. The VCO is thus adjusted via the phase detector, until the reference frequency and PLL output/N are locked in frequency and phase.

When considering a fractional-n phase locked loop, the way in which the phase locked loop operates to change a frequency is through the utilization of a frequency control word, FCW, which is a binary number that is added to the count of fractional accumulator 26. The result of adding the FCW binary number to the accumulator is a carry state that controls the switching between the two states of the PLL to vary the average frequency associated with the phase locked loop. This is the result of dithering between the n/n+1 multipliers. The reason that the fractional n phase locked loop is so designated is because it lets one control the duty cycle between the time that the two multipliers are active. The result is that the PLL output is a signal whose frequency can be altered between the two frequencies associated with the two multipliers.

For instance, if one wanted for instance to go from a fractional multiplier of 100 that represents one frequency to a fractional multiplier of 200 that represents another frequency, one would like to be able to dither between the frequencies associated with the 100 and 200 fractional multiplier, for instance to obtain a fractional multiplier of 150 that represents a frequency between the two frequencies. In order to do this one would like to have the output of the phase locked loop first reflecting the first fractional multiplier of 100 half the time and then 200 the next half. Alternatively, these fractional-n phase locked loops can adjust the duty cycle switching by for instance outputting a frequency corresponding to the 100 fractional multiplier one-quarter of the time and the 200 fractional multiplier three-quarters of the time to obtain effectively a fractional multiplier of 175 for obtaining fine frequency adjustment.

As is well known in the art, the accumulator carry bit is used to control the selection between one fractional multiplier and the next fractional multiplier. As a result the accumulator carry bit is used to switch between the two states, with the carry state or bit selecting between the n and n+1 states.

As mentioned above, signals from the fractional-n phase locked loop are not necessarily phase coherent signals when one goes from one frequency to another and then back to the same frequency. The reason resides in the operation of the accumulator. In the prior art, in order to change the duty cycle, a number is added to the clocked fractional accumulator output. As the clocking proceeds the accumulator output number is increased such that each clock pulse increments the accumulator by the clock pulse plus the added number. However, if one wants to return to the prior frequency, at this point the accumulator starts at the accumulated count, i.e. the count plus the added number. The result is that the accumulator starts at different numbers and the PLL output signal is not in phase with the original signal.

In summary, when the PLL is switched from one state, n, to the next succeeding state, n+1, this is done under the control of a carry bit count from accumulator 26. In normal operation, the accumulator is clocked to add one with each clock pulse, with the accumulator accumulating counts until it overflows. The bit existing at the time of the overflow, the carry bit, is used to switch the PLL from one of its two states to the other.

When the PLL is switched to one of its two states the leading edge of the waveform generated by the PLL is coincident with the leading edge of the carry bit from the accumulator.

Thus, the leading edge of the PLL-generated signal is coincident with the leading edge of the overflow carry bit.

The instant of time at which the accumulator reaches its overflow limit is determined by the reference clock pulse rate and any numbers that are added to the accumulator.

Thus, if the accumulator is counting 1, 2, 3, 4, 5, 6, 7, 8... with each reference clock pulse, and assuming the accumulator overflows at 10, then the overflow carry bit will be generated exactly when the counter reaches its overflow limit, in this case 10.

If, however, one wishes to fine tune the frequency of the output of the PLL, one can add a number, the FCW, to the accumulator which will result in the accumulator reaching its overflow in a shorter period of time. This results in switching the PLL from its n state to its n+1 state quicker than if no numbers were added to the accumulator. As a result the n/n+1 duty cycle will be changed to adjust the average frequency. Thus, the instant the PLL switches from one state to another would occur earlier than if no numbers were added to the accumulator. Thus one state would be active longer than the second state, with the duty cycle affecting the frequency averaging.

Aside from the duty cycle change, as a result of the switching there could be a phase difference between a priorly-generated frequency and the return to this frequency after an intervening frequency change.

The reason is that when the PLL is switched between states, the output signal from the PLL will have a leading edge displaced from the leading edge of the prior signal due to the lack of coherency between the carry bits.

Since the coherency of the PLL output signals is dependent on the phase coherency of the respective carry bits, it is important to phase align the carry bits used in generating the particular frequency. More particularly, when one wants to return to the original frequency it is important that the PLL start up with the leading edge of the PLL output signal locked in phase to the priorly-generated signal.

However, the adding of numbers to the accumulator count for duty cycle control does not necessarily result in in-phase PLL output signals. In short, with the accumulator starting in differing starting states, the carry bits will not be in phase. This results in non-coherent leading pulse edges for the PLL switching that in turn results in non-coherent output phases for the signals generated.

Figure 2:
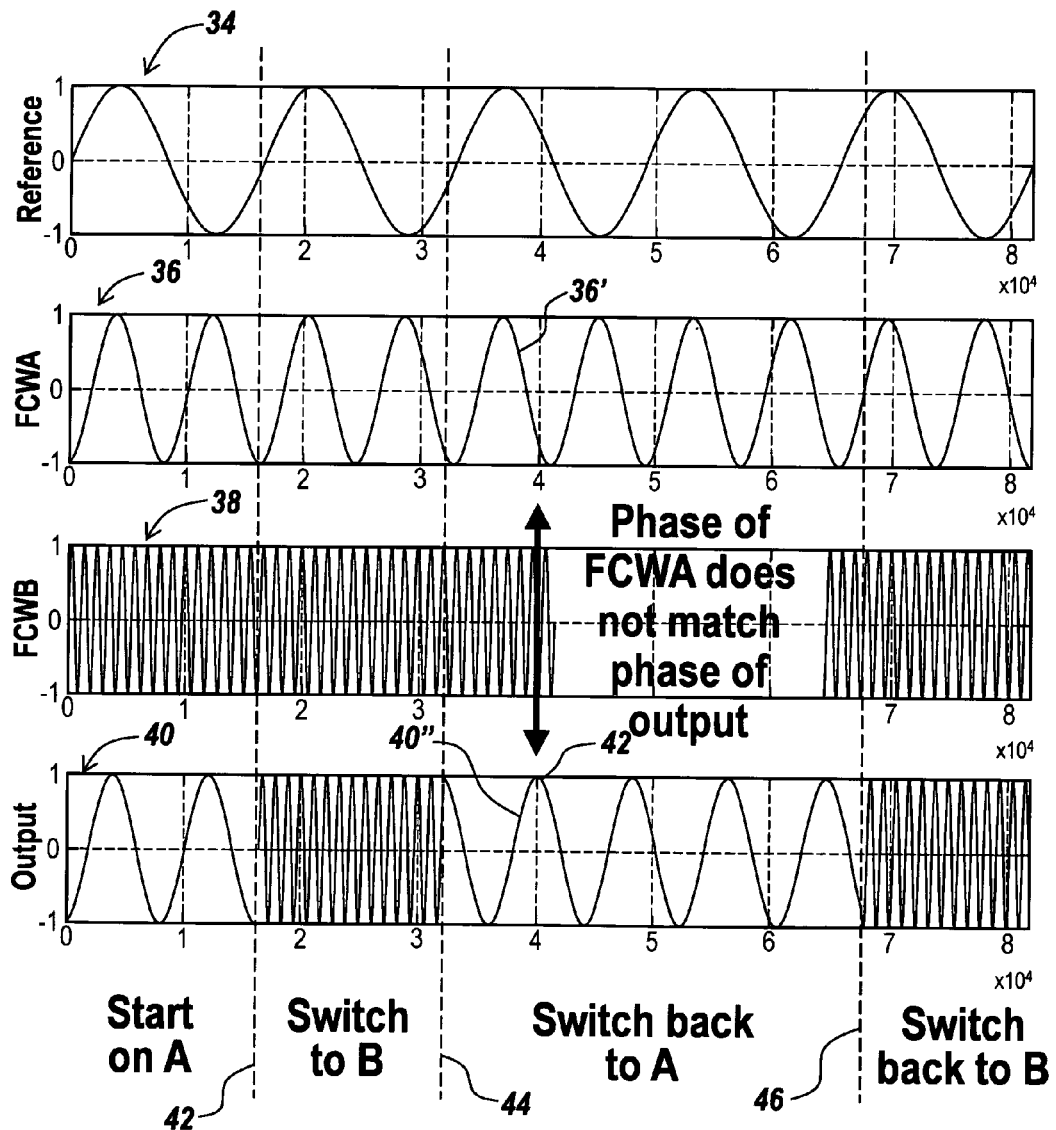
FIG. 2 is a series of waveform diagrams for the fractional-n phase locked loop of FIG. 1 illustrating that the phase of a frequency A signal is out of phase with a previously generated frequency A signal.

Referring now to FIG. 2, the result of the utilization of the standard fractional accumulator in fractional-n phase locked loops is illustrated. Here a reference signal 34 is shown juxtaposed to a frequency A signal 36, that is the result of the application of the FCWA control number to the fractional accumulator, which is in turn shown juxtaposed to a frequency B signal 38, here labeled FCWB.

The output signal from the phase locked loop is shown by waveform 40, with the demarcations between switching from frequency A to frequency B shown by dotted line 42 and switching back from frequency B to frequency A shown by dotted line 44. Dotted line 46 illustrates switching back to frequency B, all of the above being under the control of the fractional accumulator of 26 of FIG. 1.

As will be seen, the waveform 40 tracks identically to waveform 36 prior to switching from frequency A to frequency B as illustrated at 42. Here it will be seen that all of the minima and maxima line up in each of these two waveforms.

When, however, switching to frequency B where the FCW number is 3 and then switching back to frequency A where the FCW number is 1 it will be seen that waveform 40' is phase displaced from waveform 36' such that while the maxima 43 in output signal 40 occurs at time mark 4, it will be seen that the waveform 36, the previously-generated signal, actually has a minima 36' just past the time mark 4.

What will be seen is that the phase of the subsequent FCWA signal does not match the phase of the prior FCWA signal.

Figure 3:
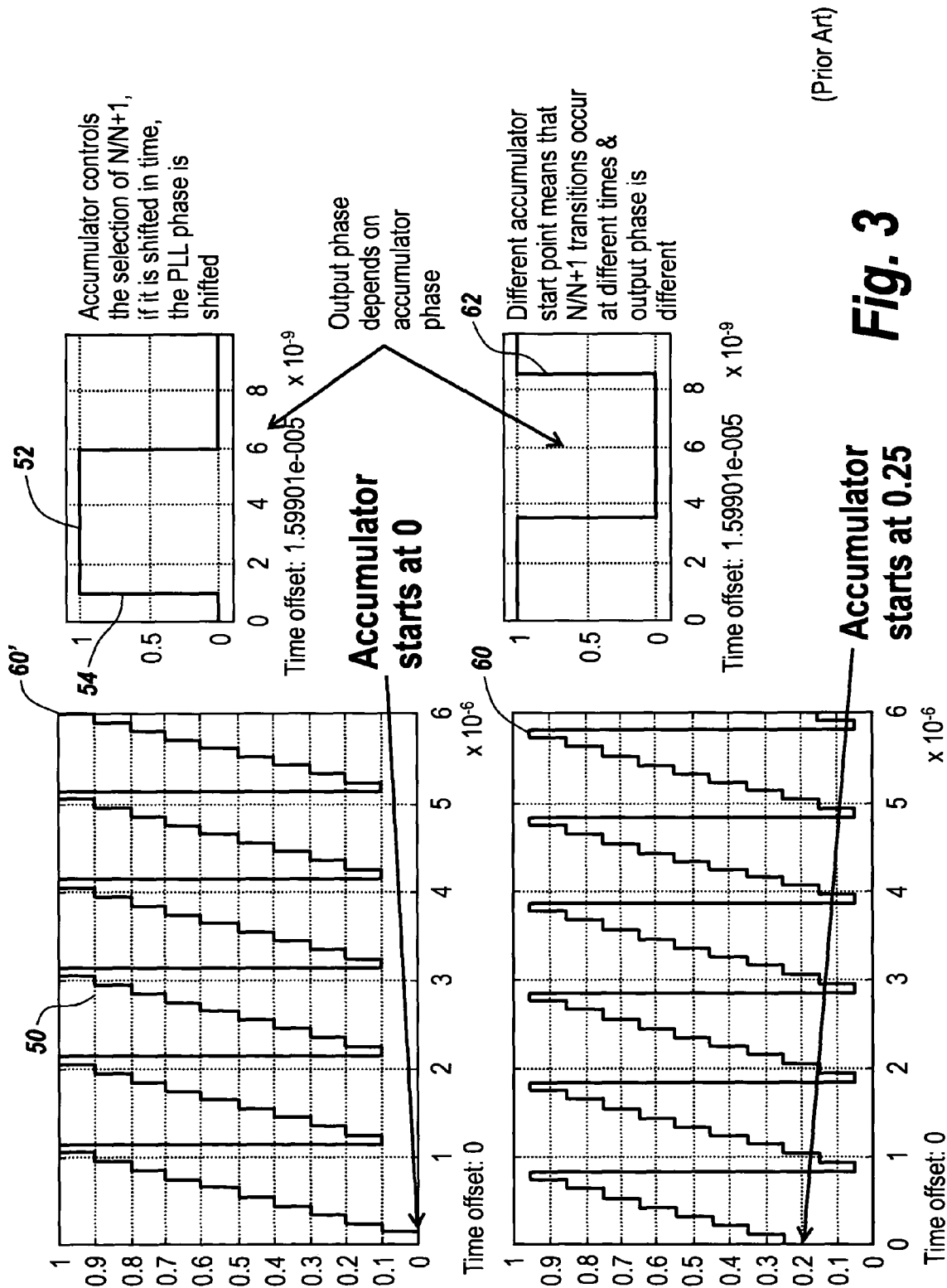
FIG. 3 is a diagrammatic illustration of the fractional accumulator counter states for a prior art fractional-n phase locked loop illustrating different start times when switching back to a frequency having switched away from this frequency, as well as the resulting out-of-phase output waveforms.

Referring now to FIG. 3, in terms of the fractional accumulator 26 of FIG. 1 it will be seen that the count 50 in the accumulator starts at 0 at time $T_0$ and is stepped up in 0.1 increments until it reaches a count of 1, at which point the accumulator overflows to generate a carry bit. The result can be seen by waveform 52 which has a leading edge 54 at time $T_1$.

However, if accumulator 26, rather than starting at a count of zero instead starts at 0.25 it will be seen that the result is that the carry bit associated with count 60 will be generated ahead of the time that the carry bit 60' would be generated if the accumulator had started at zero. The result is that leading edge 62 is out of phase with leading edge 54 leading to the aforementioned phase incoherence in the output signals from the PLL.

Figure 4:
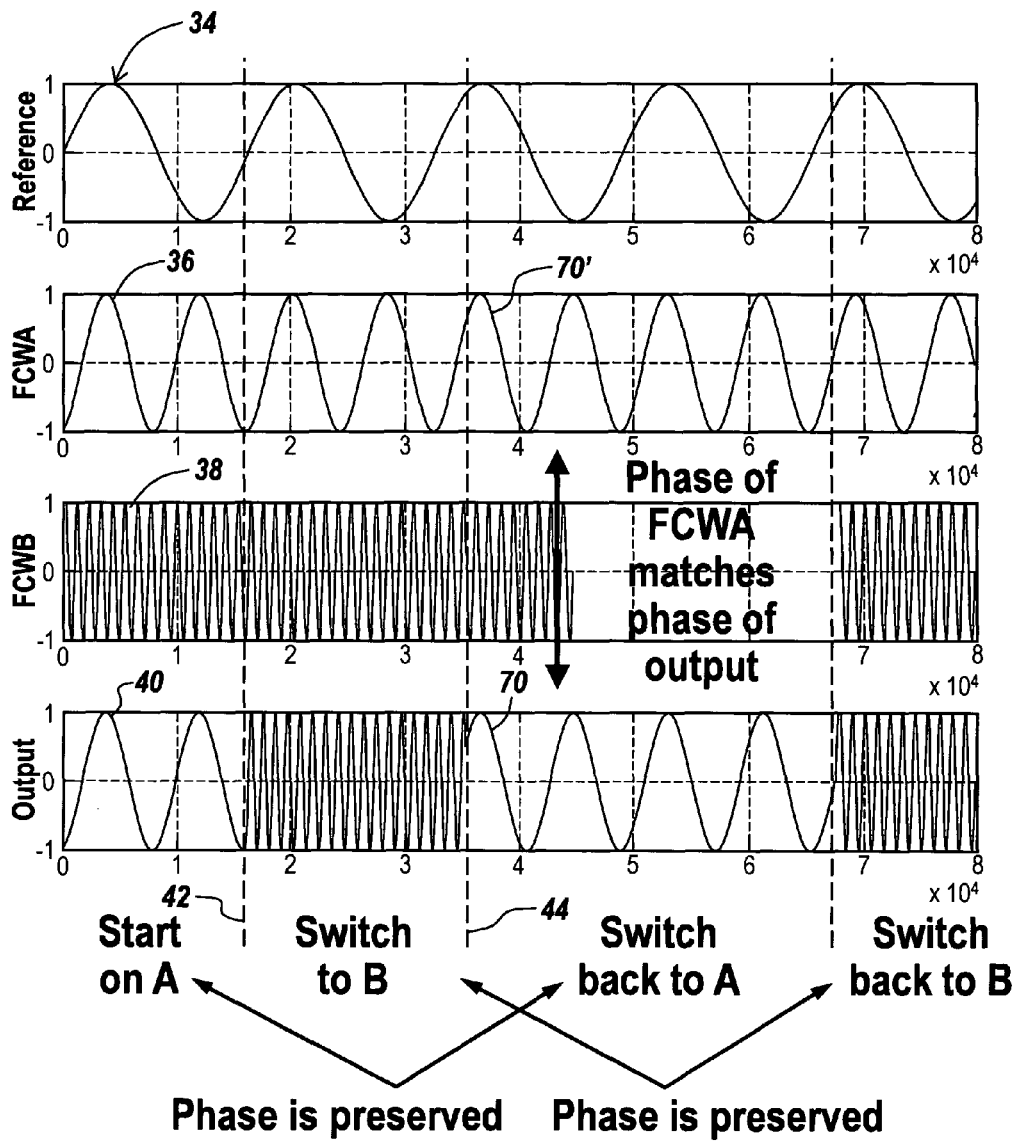
FIG. 4 is a series of waveform diagrams illustrating the desired phase coherence between a prior generation of a frequency A signal followed by switching to a frequency B signal, followed by subsequently switching back to the frequency A signal, showing phase coherence between the subsequently and priorly-generated waveforms.

Referring to FIG. 4, what is shown is the phase coherence that can be obtained by the subject system. Here, as in FIG. 2, what is shown is reference frequency 34, a frequency A waveform 36, a frequency B waveform 38 and an output waveform 40, with switching from frequency A to frequency B shown by dotted line 42. Return to frequency A is as shown by dotted line 44. However using the subject accumulator, waveform 70 at the output of the PLL is exactly in phase with waveform 70' which is a portion of the priorly-generated frequency A waveform 36. The result would be possible if the carry bit associated with the return to frequency A were to be in phase with the carry bit that was utilized to generate the priorly-generated frequency A signal.

Figure 5:
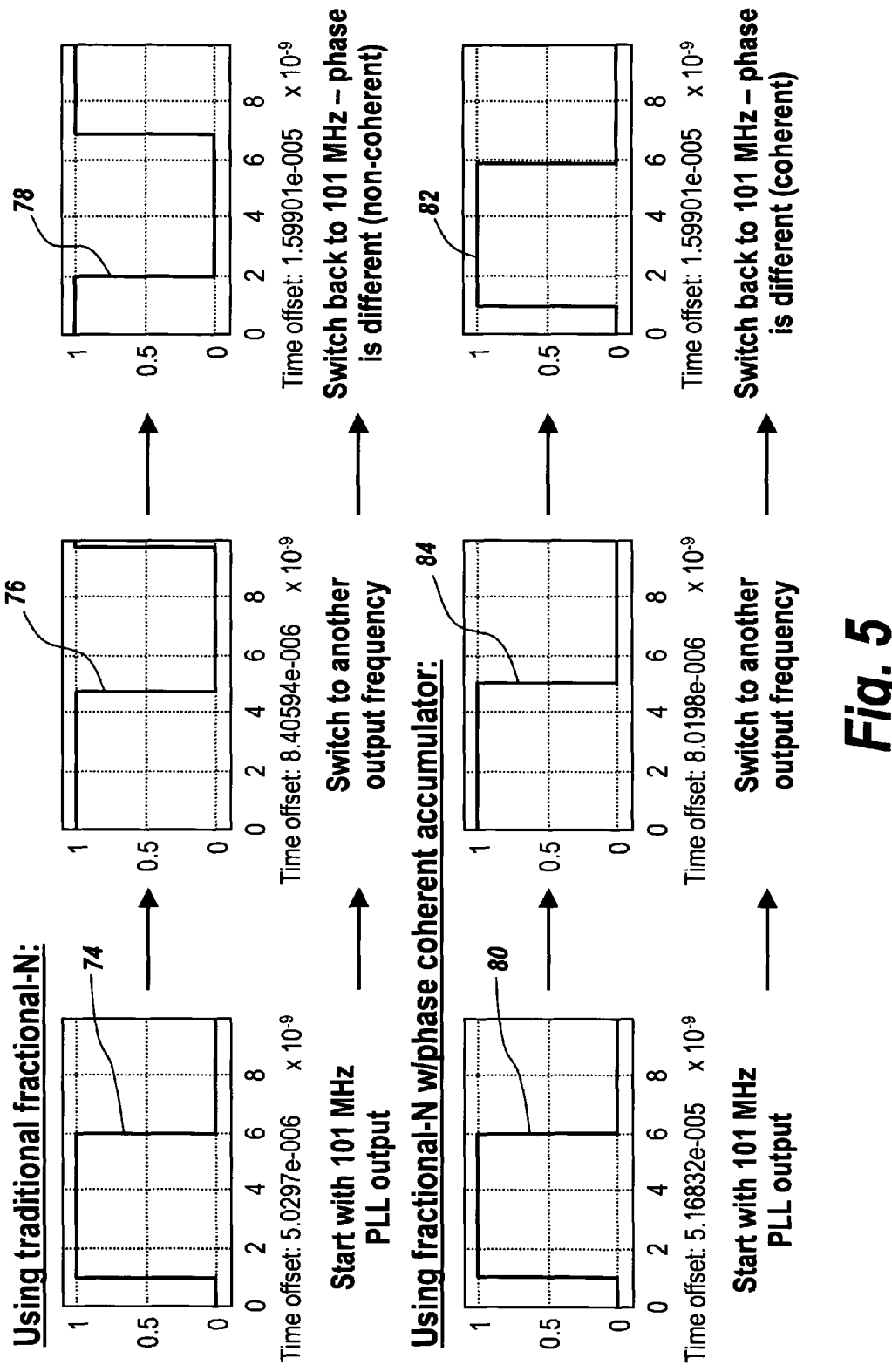
FIG. 5 is a series of waveform diagrams illustrating the output of a traditional fractional-n phase locked loop when switching from for instance 100 megahertz to another frequency and back to 100 megahertz, showing the shift in the output waveform due to the accumulator not starting at the same time as the priorly-generated 100 megahertz waveform, whereas utilizing a fractional-n phase locked loop with a phase coherent accumulator results in phase coherent output waveforms.

Referring to FIG. 5, using the traditional fractional-n phase locked loop with accumulator 26, an output waveform 74 is generated at 101 megahertz in one embodiment. When switching to a second frequency, the output is as illustrated at 76, whereas when going back to the priorly-generated frequency, the output waveform is as illustrated at 78. It will be noted that there is a phase difference between waveforms 74 and 78. This is due to the traditional duty cycle control method in which the fractional divide control number is added to the accumulator.

The desired result is to have the waveform 80 associated with the carry pulse for generating frequency A being coherently replicable as shown at 82, having gone to an intermediate frequency as shown by waveform 84. What will be shown is that it is possible to maintain phase coherence of the signals by utilizing the subject accumulator such that the carry bits generated are phase coherent when cycling between n and n+1. It will be shown that the carry bits are phase coherent regardless of the FCW number utilized to vary the duty cycle of the phase locked loop.

Figure 6:
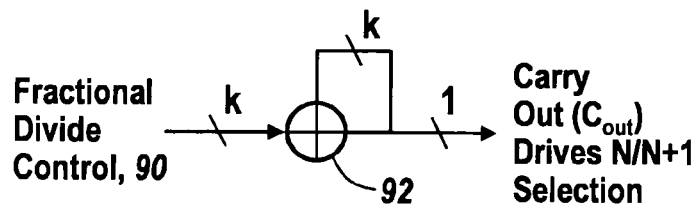
FIG. 6 is a schematic diagram of a traditional accumulator used in a fractional-n phase locked loop to generate carry bits in which a fractional divide control number is added to the count in the accumulator to control n/n+1 switching.

Referring to FIG. 6, the traditional approach is to add a fractional divide control number 90 as shown by adder 92 to the accumulator to adjust the duty cycle of the fractional-n phase locked loop and thus its output frequency.

Figure 7:
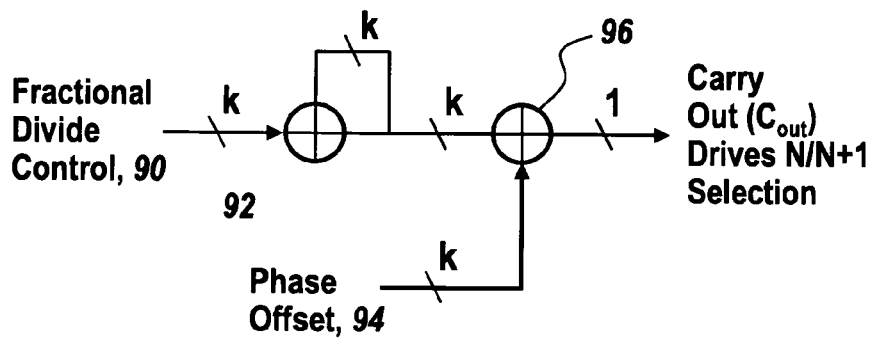
FIG. 7 is a schematic diagram of the accumulator of FIG. 6 illustrating the use of a phase offset added to the output of the accumulator of FIG. 6 to adjust the phase of the output signal from the fractional-n phase locked loop.

As shown in FIG. 7 the phase of the signals from the FIG. 6 PLL can be phase offset by using a phase offset 94 added by adder 96 to the output of the accumulator.

Figure 8:
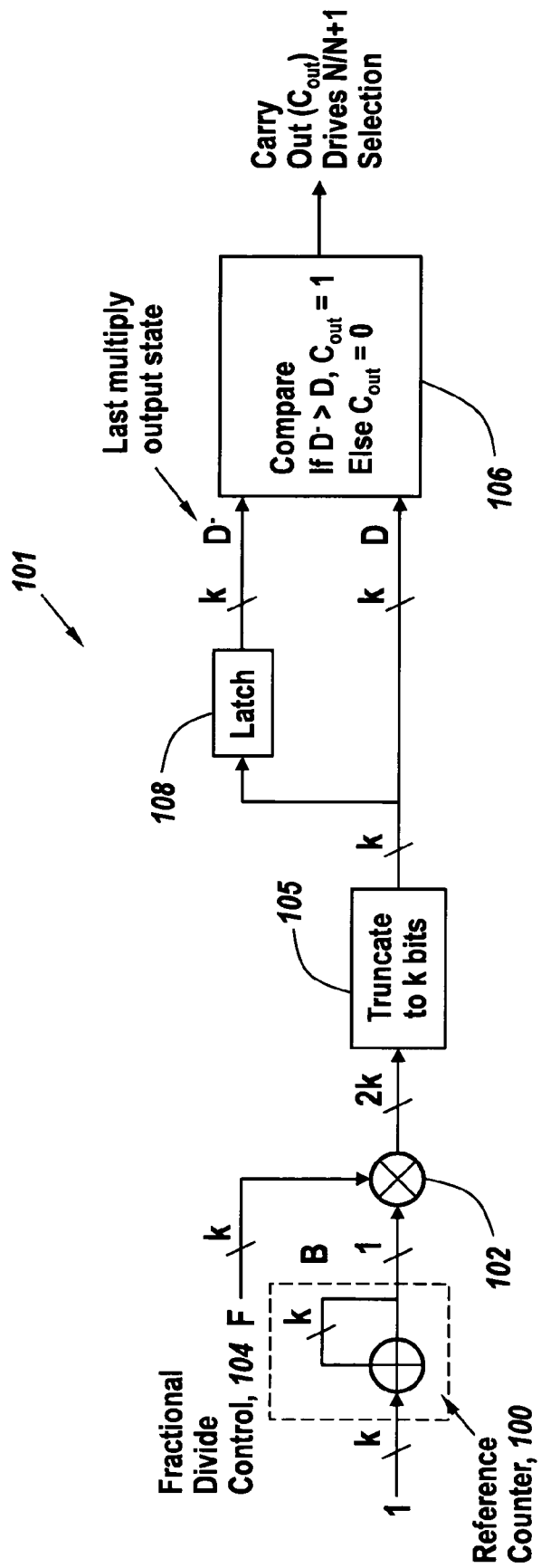
FIG. 8 is a block diagram of a fractional accumulator for use in a fractional-n phase locked loop which employs a reference counter that is incremented by one with each clock pulse, and in which the output of the counter is multiplied by a fractional divide control number, followed by truncation of the output of the multiplier, latching of the truncated output to the last multiply output state and a comparator to compare the truncated number with the last multiply output state number to generate a carry bit when the last multiply state number is larger than the truncated number.

Referring to FIG. 8, as to fractional-n phase locked loop 101, unlike adding numbers to an accumulator in order to effectuate duty cycle control, in the subject invention the subject accumulator multiplies the output of a reference counter with the frequency control number to effectuate duty cycle control. To this end, a reference counter 100 is clocked to increase one number at a time and has its output coupled to a multiplier 102 to which a fractional divide control number 104 is applied. Multiplier 102 is coupled to a truncator 104 which truncates the output of multiplier 102 to the bit width of the control number, here k bits. The output of the truncator is applied to one input to a comparator 106 and also to a latching circuit 108, the output of which is the last multiply output state. The last multiply output state is designated by D−, whereas the output of the truncator is designated D. When D− is greater than D, the carry bit is generated, whereas at all other times the output of the comparator is equal to zero.

It will be shown that by multiplying the output of the reference counter 100 by a rational number F there is phase coherence between a carry bit used to generate a prior frequency and a subsequently generated carry bit that is used to generate a replica of this frequency.

Figure 9:
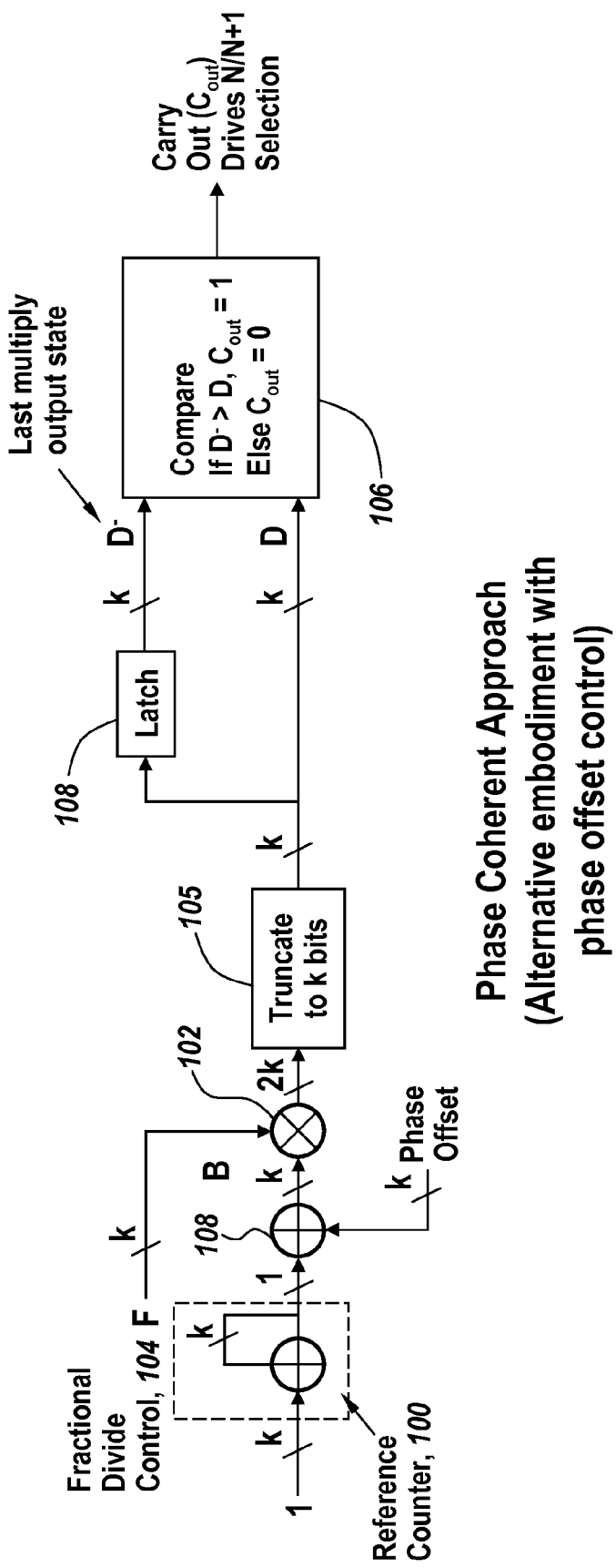
FIG. 9 is a block diagram of the accumulator of FIG. 8 in which a phase offset is applied to the fractional accumulator of FIG. 8 by adding a number to the output of the reference counter.

As illustrated in FIG. 9, to provide phase offset control, an offset number may be added by adder 108 to the output of reference counter 100 prior to this number being multiplied by the fractional divide control number 104 at multiplier 102.

Considering the FIG. 8 and FIG. 9 embodiments it is important to note that the difference between the traditional approach for duty cycle control by adding a number to an accumulator and the present invention is that the duty cycle control number F is multiplied by the output of a reference counter to establish phase coherency between the carry bits, with the reference counter providing a phase baseline. Thus, the difference in the two approaches is between adding the frequency divide control number F to the accumulator and multiplying the frequency divide control number F with the output of a reference counter. This accomplishes two things. First, the fractional divide control number adjusts the duty cycle so that the duty cycle between n and n+1 may be varied at will. Secondly, the fractional divide control number F multiplying the output of the reference counter establishes coherency between the carry bits, as the timing of the carry bits for a given frequency will be slaved to reference counter timing. This is because carry bit timing will be an exact multiple of the time at which reference counter bits are generated.

Figure 10:
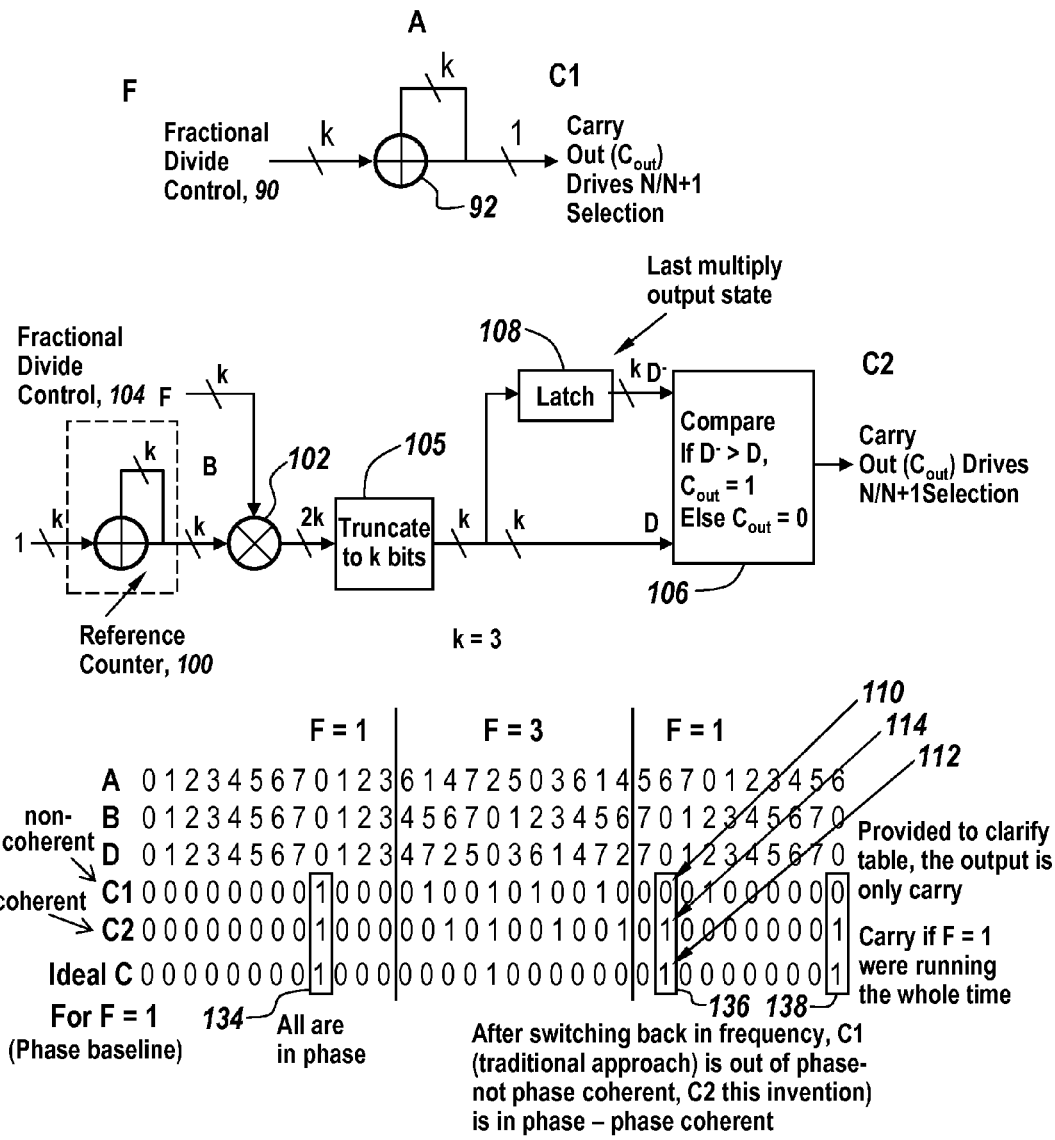
FIG. 10 is a diagrammatic illustration of the operation of the traditional fractional-n PLL accumulator and the subject accumulator in terms of a table showing that when switching a frequency control word number from F=1, to F=3, then back to F=1, the output of the traditional accumulator is out of phase with a phase baseline in the form of an ideal counter output utilized to keep track of the phase of the priorly-generated frequency A signal, whereas the subject accumulator results in a carry bit to generate the subsequent frequency A signal which is in phase with the carry bit used to generate the priorly-generated frequency A signal; and, FIG. 11 is a diagrammatic illustration showing the operation of the subject fractional accumulator.

Referring to FIG. 10, the traditional accumulator system involving addition and the subject accumulator involving multiplication are shown atop a table indicating the output states of respective accumulators. The traditional fractional accumulator 92 has an output A and is provided with a fractional divide control number 90, namely F. The subject accumulator includes reference counter 100 having an output B coupled to a multiplier 102 to which is supplied fractional divide control number 104, F. As mentioned above, in the subject system, the output of multiplier 102 is truncated to k bits by truncator 105 or by a multiplier that outputs least significant bits. The output of truncator 105, D, is coupled to comparator 106. The output of truncator 105 is also coupled to latch 108, the output of which, D–, is coupled to the other input to comparator 106. Here D– is the last multiply output state that existed before D is generated. When D– is greater than D, a carry out bit=1, labeled C2, is generated to drive the n/n+1 selection.

As can be seen, the traditional accumulator is provided with fractional divide control number F that is summed with the contents of the accumulator.

In contradistinction, the subject accumulator utilizes a reference counter and a multiplier.

Note, the carry bit output of the traditional accumulator is labeled C1, whereas the output of the subject accumulator utilizing the reference counter and multiplication is indicated by C2. It will be appreciated that C1 relates to the non-coherent case, whereas C2 relates to the coherent case.

In terms of phase, a phase baseline is established by the output of reference counter 100, here indicated by Ideal C. Note that the phase baseline keeps regular track of the generation of carry bits for F=1 where counter 100 is running all the time.

With reference counter 100 running, in one embodiment the generation of carry bits initially occurs after 8 clock pulses to reference counter 100, with the reference counter being a modulo 3 counter that overflows after the 7th count to generate a carry bit.

What will be appreciated is that if the F=1 carry bits can be generated phase coherently with the carry bits of Ideal C, there will be phase coherence between the F=1 carry bits. This can be seen by the fact that the carry bit generated by the subject accumulator shown at 114 is 1 at the same time that the carry bit 112 from the phase baseline, Ideal C, is 1. It is noted that this corresponds to phase coherence of the F=1 carry bits regardless of having switched to F=3 and then back.

On the other hand in the non-coherent case, C1 has a value of 0 as illustrated at 110 at the time that the Ideal C carry bit is 1, meaning that in the non-coherent case the carry bit generated by the traditional method is not generated time coincident with carry bit 112 from the phase baseline.

Thus, as can be seen, all carry bits are initially in phase between C1, C2 and Ideal C. This phase relationship is not however preserved for the non-coherent case after switching to F=3 and then back to F=1. The reason is that the traditional accumulator starts up at a different time when it switches back to the original frequency. In the subject invention, the reason that the carry bits are in phase is because the duty cycle control number F is multiplied with the output of the reference counter. This means that the time that a subsequent carry bit is generated is a multiple of the time that a prior F=1 the carry bit was generated.

Thus, it will be seen that with the phase locked loop using the subject accumulator the phase of the carry bits involved in the F=1 signals are in phase, resulting in the coherency of the associated signals generated at the output of the phase locked loop.

More specifically in the operation of the subject invention and referring again to FIG. 10 in the table row A refers to the count in counter 92. Here it can be seen in one embodiment that accumulator 92 rolls over after the 7th bit such that after the accumulator goes from 0 to 7 and the count is incremented by 1 and the counter rolls back over to 0, at which time a carry output bit is generated. This is shown by the row labeled C1 which is the output of the traditional fractional accumulator.

Row B indicates the output of the reference counter used in the subject invention which is incremented by 1 such that the count in the counter which starts at 0 goes to 1, 2, 3, 4, 5, 6 and 7, whereupon it rolls over to 0 at the 8$^{th}$ bit and starts again. Note that the reference counter B operates independently of the fractional divide control number.

As before, the fractional divide control number for the accumulator is labeled F in this diagram. It is this number which is either to be added to the accumulator or multiplied by the output of reference counter 100.

With respect to row D, this is the output of the multiplier 102 after the multiplier output has been truncated. Truncation in this case refers to the 3 the least significant bits or LSBs of the multiplication.

Considering the subject accumulator, initially when F=1, multiplying B by 1 results in the same number string, namely 0 times 1 is 0, 1 times 1 is 1 . . . etc. Note that when the fractional divide control number is 3, then the reference counter output B is multiplied by 3 after which it is truncated to its least significant digits, by subtracting 8, if the counter used rolls over to 0 on the 8$^{th}$ clock pulse.

Note when the subject system rolls over from F=1 to F=3, the last number out of the reference counter is 3 which is multiplied by 3 so that one has 12. However, truncating to 12–8=4 and one arrives at 4 in row D.

Thereafter, after one clock pulse, in row D one can see that there is a number 7. This is because 5 in row B is multiplied by 3 to get 15 and 15–8=7.

Moving on, the next number in the D row is 2. It will be appreciated that this is generated because 6 in row B is multiplied by 3 to yield 18–16=2.

Thus, in the generating of the numbers in row D one takes the output of the reference counter and multiplies it by the particular fractional divide control number F which is then truncated down to k bits, in this case k=3, which results in D.

Figure 11:
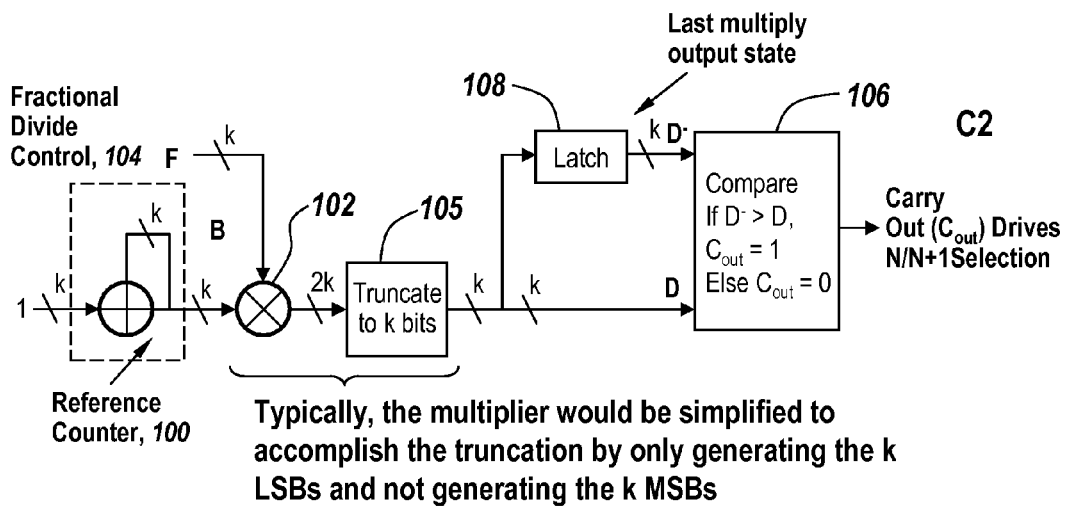
Figure 11:
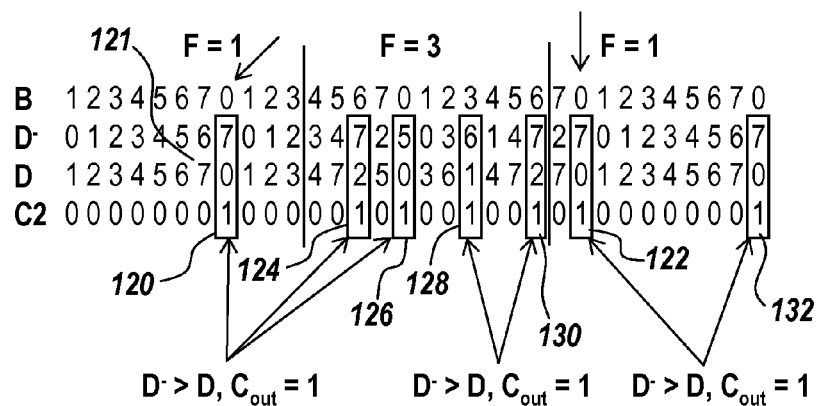

Having defined D for the subject invention and having defined the relationship D– greater than D resulting in $C_{out}$=1, as can be seen in row C2 relating to the output of the subject accumulator, C2 is 1 the first time that the reference counter B rolls over. This is shown at 122. The reason as will be seen in FIG. 11 is that the rollover number occurs when D– is equal to 7 and D is equal to 0. Since 7 is greater than 0, a 1 is generated for row C2. It will be noted at this time that the corresponding number in Ideal C is 1 and the number in C2 is also 1 indicating phase coherence.

Referring now to C1 in FIG. 10, which is the non-coherent case, C1=$C_{out}$=1 is generated when one rolls over the maximum accumulator value, in this case 7, such that at, least initially, the carry bit 1 in C1 is time coincident with the Ideal carry bit 1. This is because C1 rolls over from 7 to 0 after the 7$^{th}$ pulse since the accumulator overflows at 7. It therefore rolls over to 0 on the 8$^{th}$ count.

For row C1, once one has gone from F=1 to F=3 one is adding 3 to the A count 3 to get 6. Thereafter one adds 3 to the 6 in the A count such that one gets 9, which is truncated to 1, i.e. 9–8=1. One then adds 3 to 1 to get 4 and one adds 3 to 4 to get 7 after which one adds 3 to 7 to get 10–8=2. Since this creates a rollover in accumulator 92, C1 registers a carry bit 1 as illustrated. Note that when one adds 3 to 7 one gets 10 which truncates down to 2 and one generates a carry bit.

When one then adds 3 to 2 in row A one gets 5 with no carry bit and when one adds 3 to 5 one gets 8, i.e. 8–8=0 that results in a rollover to 0 with a carry bit generated, again out of phase with Ideal C. One then adds 3 to 0 to get a 3 with no carry bit and one then adds 3 to 3 to get a 6, again with no carry bit, after which one adds 3 to 6 =9−8=1 to obtain the last carry before the change from F=3 to F=1. Again there is no phase coherence with Ideal C. Note that before the switch from F=3 to F=1 at the next clock pulse one adds 3 to 1 to get 4 again with no carry bit.

Again with respect to the C1 output after there is a change from F=3 to F=1 one adds 1 to the 4 which equals 5.

Note that it is not until row A goes from 7 to 0 that one has a carry bit 1 in row C1. Again this is not phase coherent with Ideal C.

Importantly, after F=3 goes to F=1, when Ideal C has a carry bit at 112, it will be seen that there is no carry bit 110 in row C1, but there is one for the coherent C2 as shown at 114. Thus, it can be seen that the carry bit generation for C1 is not in phase with the phase baseline carry bits for F=1. Therefore after F=3 changes to F=1 there is no phase coherence for the F=1 signal with the priorly-generated F=1 signal.

Referring now to FIG. 11, the subject accumulator is shown with like reference characters referring to like elements. Assuming for example a bit width k=3 then as can be seen from the state table at the bottom of FIG. 11 the states of D−, D and C illustrated at 120 for an initial generation of F=1 are identical to the states illustrated at 122 for a subsequent generation of F=1. What this says is that the carry bit for the subsequently generated F=1 signal is phase coherent with the carry bit initially utilized to generate the previous rendition of the F=1 signal.

Note in FIG. 11 the operation of the subject invention is described in the state table, in which B describes the output of reference counter 100 and in which D describes the truncated output of multiplier 102. D−, on the other hand is defined as the last multiply output state.

As can be seen in row D− at 120 the 7 in this row corresponds to the 7 in row D illustrated in reference character 21 which is the preceding last multiply output state. Also as mentioned before, since D− equals 7 and D equals 0 then D− is greater than D and a carry bit is generated as illustrated for row C2 at 120.

When F=1 changes to F=3 it will be seen for row C2 that the carry bits are generated as indicated by 124, 126 and 128, since for 124, 7 is greater than 2, 5 is greater than 0, and 6 is greater than 1.

Note, that when returning to F=1 row D− has a 2 which corresponds to the 2 in the previous last multiplied output state illustrated at 130.

On the next clock pulse D− is 7, whereas D is equal to 0. 7 is the last multiply output state, whereas 0 corresponds to incrementing a previous 7 in row D by 1. As can be seen at 122, 7 is greater than 0 resulting in a carry bit 1 as illustrated.

Having described the operation of the subject accumulator, and referring back to FIG. 10, what will be seen from FIG. 10 is that all the C2 carry bits for F=1 are in phase with the phase baseline, namely Ideal C, such that as shown at 134, 136 and 138 there is phase coherence with the output from C2 and the phase baseline such that with carry bit phase coherence there is signal coherence.

In short, rather than utilizing a traditional accumulator in which a frequency control word is added to the accumulator output, one now multiplies a reference counter output with the number associated with the frequency control word, with the multiplication preserving the in-phase relationship of the carry bits and thus provides phase coherence for the PLL signals.

What is claimed is:

1. In a fractional-n phase locked loop, apparatus for maintaining phase coherence between output signals initially generated at one frequency and then subsequently generated, comprising:
   a fractional accumulator for providing as an output a carry bit used to control the n/n+1 switching of the phase locked loop in response to a fractional divide control word number, multiplied at a multiplier by the output of a reference counter.

2. The apparatus of claim 1, and further including a phase offset generator and an adder coupled between said reference counter and said multiplier such that the number added to the reference counter output at said adder prior to multiplication provides a fixed phase offset for the signals generated by said phase locked loop.

3. The apparatus of claim 1, wherein the output of said multiplier is coupled to a truncator to truncate the output of said multiplier.

4. The apparatus of claim 3, and further including a comparator having a first input coupled to the output of said truncator and a latch coupled to the output of said truncator, the output of said latch coupled to a second input of said comparator, wherein the output of said latch corresponds to the last multiply output state.

5. The apparatus of claim 4, wherein said comparator generates said carry pulse when the output of said latch circuit is greater than the output of said truncator.

6. The apparatus of claim 1, wherein said multiplier generates only a predetermined number of least significant bits.

7. The apparatus of claim 6, wherein the predetermined number of least significant bits corresponds to the bit width of said fractional divide control number.

8. The apparatus of claim 6, and further including a comparator having a pair of inputs, one of said inputs coupled to the least significant bit output of said multiplier.

9. The apparatus of claim 8, and further including a latch coupled to the output of said multiplier for outputting the last multiply output state of said multiplier.

10. The apparatus of claim 9, wherein said comparator generates a carry bit output when said last multiply output state is greater than the current output state of said multiplier.

11. The apparatus of claim 2, and further including a multiplicity of said fractional-n phase locked loops, each of said phase locked loops including said phase offset generator and an adder for adding said phase offset to the associated reference counters and multipliers of said multiplicity of fractional-n phase locked loops.

12. The apparatus of claim 11, wherein said phase offset generator for each of said phase locked loops is adjustable to adjust the phase relationship between the output signals from said multiplicity of said phase locked loops.

13. The apparatus of claim 12, wherein the phase relationship between selected ones of said multiplicity of said phase locked loops can be adjusted to a predetermined phase relationship.

14. The apparatus of claim 13, wherein said phase relationship includes an in phase relationship.

15. A method for providing a fractional-n phase locked loop with phase coherence between output signals of the same frequency that are shifted from the same frequency to a different frequency and then back to the same frequency due to the duty cycle operation of the phase locked loop, comprising the steps of:
   controlling the n/n+1 divider used in the fractional-n phase locked loop utilizing a carry bit from a fractional accumulator and, assuring that a carry bit utilized by the fractional accumulator to generate a subsequent instance of the same frequency signal is phase coherent with the carry bit utilized in the generation of the same frequency signal, such that the subsequently generated signal is in phase with the previously generated signal from the fractional-n phase locked loop.

16. The method of claim 15, wherein the step of assuring the phase coherence of the carry bits includes generating carry bits that are phase coherent with the output of a reference oscillator.

17. The method of claim 16, wherein the step of assuring phase coherence includes the step of multiplying the output of a reference counter utilizing a multiplier with a fractional divide control word used to control the duty cycle of the switching associated with the fractional-n phase locked loop.

18. The method of claim 17, and further including the step of truncating the multiplied output to the number of bits associated with the width of the fractional divide control number.

19. The method of claim 18, wherein the truncation step includes providing a multiplier that only outputs least significant bits.

20. The method of claim 18, wherein the step of providing phase coherence for the carry out bits includes comparing the truncated multiplied output with the last multiplied output state of the multiplier such that a carry out bit is generated when the last multiplied output state is greater than the present multiplied output state.

\* \* \* \* \*